United States Patent [19]
Gardner et al.

[11] Patent Number: 6,096,658
[45] Date of Patent: Aug. 1, 2000

[54] SEMICONDUCTOR DEVICE HAVING IN-DOPED INDIUM OXIDE ETCH STOP

[75] Inventors: Mark I. Gardner, Ceder Creek; Mark C. Gilmer, Austin, both of Tex.

[73] Assignee: Advanced Micro Devices, Sunnyvale, Calif.

[21] Appl. No.: 09/057,091

[22] Filed: Apr. 8, 1998

[51] Int. Cl.$^7$ .................................................. H01L 21/00
[52] U.S. Cl. ..................... 438/720; 438/722; 438/740; 438/742
[58] Field of Search ........................ 438/720, 722, 438/740, 742

[56] References Cited

U.S. PATENT DOCUMENTS

| | | | |
|---|---|---|---|
| 5,555,486 | 9/1996 | Kingon et al. | 361/305 |
| 5,783,483 | 7/1998 | Gardner | 438/627 |
| 5,801,094 | 9/1998 | Yew et al. | 438/624 |
| 5,883,410 | 3/1999 | So et al. | 257/329 |

*Primary Examiner*—Benjamin L. Utech
*Assistant Examiner*—Vanessa Perez-Ramos
*Attorney, Agent, or Firm*—Crawford PLLC

[57] ABSTRACT

A process for forming a semiconductor device using a conductive etch stop. The process includes the steps of fabricating a wafer structure up to a first level oxide deposition. A conductive etch stop is deposited over the first level oxide deposition, and selected portions of the conductive etch stop are removed. An inter-level oxide layer is deposited on the conductive etch stop, and selected portions of the inter-level oxide deposition are etched up to the conductive etch stop. The conductive etch stop may be either removed from the semiconductor or left as a conductor.

14 Claims, 1 Drawing Sheet

SEMICONDUCTOR DEVICE HAVING IN-DOPED INDIUM OXIDE ETCH STOP

FIELD OF THE INVENTION

The present invention is directed generally to a semiconductor device and method of manufacture thereof, and more particularly, to such a device and method having an oxide etch stop.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices has been manufactured having various applicability in numerous disciplines. One such silicon-based semiconductor device is a metal oxide conductor used, for example, in connection with solar cells.

The principal elements of a typical MOS semiconductor device generally include a gate electrode acting as a conductor to which an input signal is applied via gate terminal. Heavily doped source and drain regions are formed in a semiconductor substrate below the gate electrode. These regions are respectively connected to source and drain terminals typically located on either side of the gate electrode. The source and drain regions are separated by a channel region formed in the semiconductor substrate beneath the gate electrode. The channel region is typically lightly doped with a dopant-type that is opposite that of the source and drain regions. The gate electrode is physically separated from the semiconductor substrate by a gate insulating layer. In many instances, the gate insulating layer is an oxide such as silicon dioxide ($SiO_2$). The insulating layer is implemented to impede current flow between the gate electrode and the semiconductor source, drain and or channel regions.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region and drain region. In this manner an electric field controls the current flow through the channel region. This type of device is commonly referred to as a MOS Field Effect Transistor (MOSFET).

Semiconductor devices, such as the one described above, are used in large numbers in most modern electronic devices. The semiconductor devices such as the one described above are manufactured through a series of steps carried out in a particular order. One important objective in manufacturing such devices is to manufacture devices that conform to the geographical features of the designs for the devices. Such an objective is achieved by closely controlling the manufacturing process to ensure that rigid requirements of, for example, exacting tolerances, quality materials and clean environment are satisfied.

A wide variety of processing techniques may be employed in manufacturing silicon-integrated circuit devices. The formation of these devices generally begins with a silicon wafer having a desired pattern transferred to the surface of the wafer. Often, a layer of silicon dioxide ($SiO_2$) is grown upon the surface of the wafer. Silicon dioxide serves as an insulative material and so is often used to separate various semiconducting layers of integrated circuit devices.

The silicon dioxide is formed on the wafer surface in uniform layers or in particular patterns, as desired. Various techniques such as photolithography, may be employed to achieve the desired wafer surface patterns. In photolithography, a photo-resist material, for example, a photo-sensitive polymer, may be layered atop a generally uniform silicon dioxide layer on a wafer surface. A mask having a desired pattern of clear and opaque areas may then be positioned atop the photo-resist layer. Photo-resist material selectively responds to ultra-violet (UV) light. This selective response characteristic of the photo-resist material results in the formation of particular patterns of photo-resist material atop the silicon dioxide. Once a particular pattern of photo-resist material is formed atop the silicon dioxide of a wafer, portions of the wafer topped by silicon dioxide but not topped by photoresist may then be etched away from the wafer surface. Etching is a common procedure employed in the manufacture of silicon-integrated circuit devices. Generally, the process of etching involves selectively removing portions of a workpiece. The etching process yields for further processing a workpiece having a desired geographical arrangement. After the etch process, the photo-resist material is removed by a subsequent processing step, thereby leaving the silicon wafer topped only by selective configurations of silicon dioxide. While there are a variety of different types of etch processes, an important objective in each such process is the removal of a particular material(s) from the wafer without damaging the wafer.

As previously mentioned, it is important to closely control the various steps used in the manufacturing process. This general rule is specifically applicable to most every etching process. For example, by failing to control the overall duration of the etching process, or by failing to appropriately direct the etching toward certain target portions, the etching process may alter intricately formed portions of the wafer that were not intended to be altered by the etching process. To ensure that the overall duration of the etching process and/or its directivity does not adversely affect the wafer structure, "etch stops" are used to protect those portions of the wafer that are susceptible to such damage. In some applications, the material or materials used as etch stops are removed subsequent to the etching process.

By removing the etch stop after the etching process, the desired geographic configuration at this stage of the chip manufacturing process is realized. If, however, the etch stop is not completely removed, the residual material can adversely affect the performance of the silicon integrated circuit device. For example, silicon nitride, an insulator, has been used as an etch stop. If all the silicon nitride is not removed, then the silicon device being manufactured may be defective under certain conditions or environments due to the residual silicon nitride material providing undesirable resistance between structures intended to be conductively connected.

Designers and manufacturers of silicon integrated circuit devices understand that such circuit imperfections will occur and, for this reason, compensate therefor in the design and manufacturing process. It is, of course, preferable to reduce the likelihood of such imperfections wherever possible. Accordingly, designers and manufacturers of silicon integrated circuit devices continue to search for improved methods and structures to maintain desired wafer geographic configuration and eliminate process impediments such as undesired etch stop residues.

SUMMARY OF THE INVENTION

The present invention is directed to integrated circuit device structures and manufacturing methods involving the use of materials such as Indium Tin Oxide (ITO) and Yttrium Barium Copper Oxide (YBCO) as etch stop materials.

According to a specific example embodiment of the present invention, an integrated circuit manufacturing process includes the steps of fabricating a wafer structure up to a first level oxide deposition. A conductive etch stop is deposited over the first level oxide deposition, and selected portions of the conductive etch stop are removed. An inter-level oxide layer is deposited on the conductive etch stop, and selected portions of the inter-level oxide deposition are etched to the conductive etch stop. The conductive etch stop may be either removed from the semiconductor or left as a conductor portion of the integrated circuit.

Another aspect of the present invention is directed to a structure that includes the conductive etch stop material as an integral part of the structure. For example, using the process discussed above, a silicon integrated circuit device includes a silicon substrate; an oxide layer deposited on the substrate; a first metallic oxide etch stop deposited on the oxide layer; an inter-level oxide layer deposited on the first etch-stop; and a first conductor extending through the inter-level oxide layer to the first etch stop. Residual conductive etch stop material acts as an electrical coupler rather than a resistor.

The above summary of the present invention is not intended to describe each illustrated embodiment or every implementation of the present invention. The figures in the detailed description which follow illustrate other and more particular example embodiments.

BRIEF DESCRIPTION OF THE DRAWINGS

The invention may be more completely understood in consideration of the following detailed description of the various embodiments of the invention in connection with the accompanying drawings, in which.

While the invention is amenable to various modifications and alternative forms, specifics thereof have been shown by way of example drawings and will be described in detail. It should be understood, however, that the intention is not to limit the invention to the particular embodiments described. On the contrary, the intention is to cover all modifications, equivalents, and alternatives falling within the spirit and scope of the invention as defined as the appended claims.

DETAILED DESCRIPTION OF THE VARIOUS EMBODIMENTS

The present invention provides a semiconductor device and method for using Indium Tin Oxide (ITO) and Yttrium Barium Oxide (YBCO) as metal oxide etch stops for L1 or tungsten contact etch processes. ITO are YBCO are advantageous as etch stops because of their high conductivity. For example, during the manufacture of a semiconductor device, if all of the ITO or YBCO is not removed, its low resistivity characteristic does not result in lower yields nor does it reduce device performance, as is the case with etch stop materials such as silicon nitride. The present invention is applicable to a number of semiconductor devices including, for example, MOS, CMOS, Bipolar, and BiCMOS transistors. While the present invention is not necessarily limited to such devices, an appreciation of various aspects of the invention is gained through a discussion of various fabrication processes and device characteristics in connection with the examples provided below.

Figure 1:
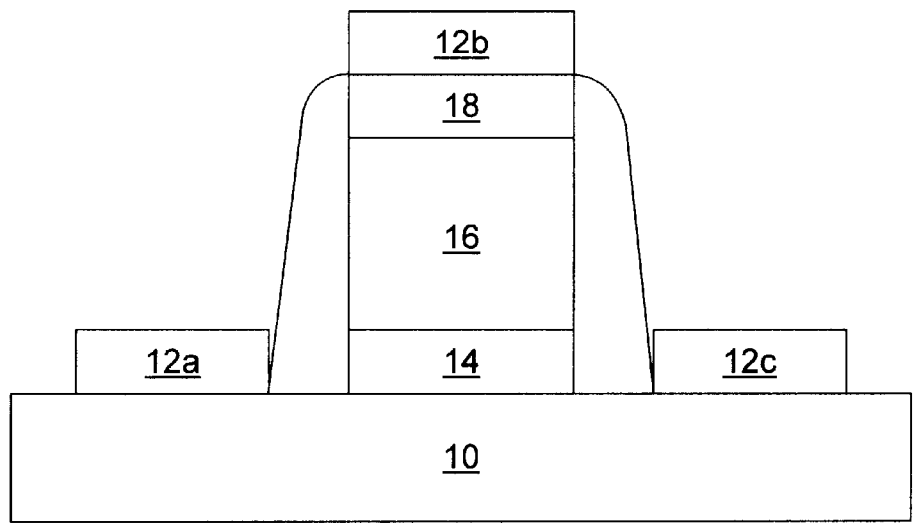
FIG. 1 is a cross-sectional view of a portion of a semiconductor device, in accordance with an example embodiment of the present invention.

Referring now to FIG. 1, a portion of a semiconductor device is shown from a cross-sectional perspective. The device includes a silicon substrate 10, having deposited thereon a first oxide layer (not shown). A conductive metallic oxide material, such as ITO or YBCO, is used for elements 12a, 12b and 12c. Etch-stop elements 12a and 12c are deposited over substrate 10 by sputtering or CVD. Between the conductive substrate material 12b and the silicon substrate material 10, the device includes a dielectric gate element 14, a poly-silicon portion 16 and a Ti Silicide portion 18. Ti Silicide portion 18 is formed by Ti deposition or anneal sequencing.

Figure 2:
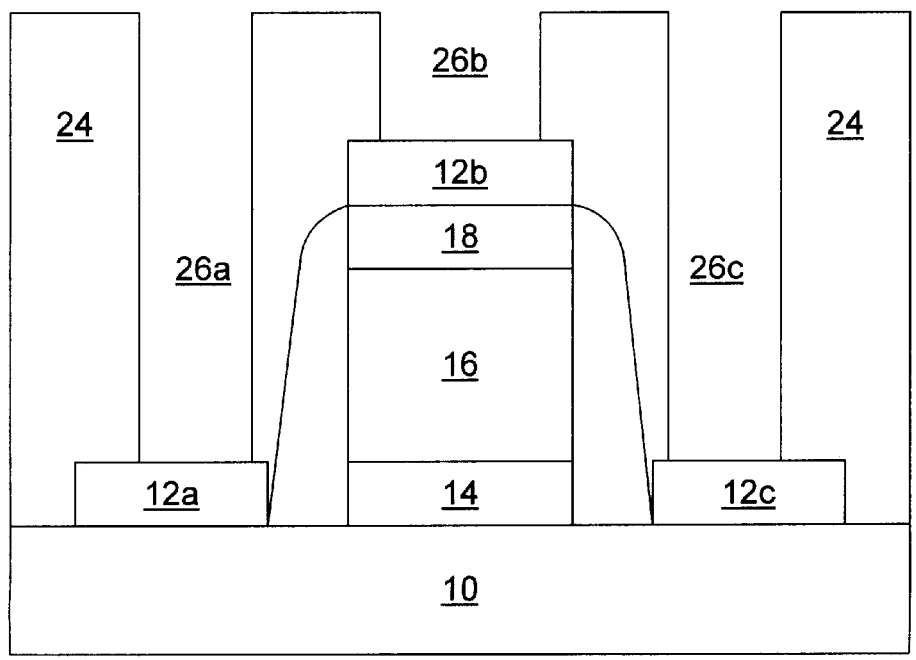
FIG. 2 is another illustration of the structure of FIG. 1, but at another stage of the manufacturing process for the semiconductor device of FIG. 1.

FIG. 2 shows an inter-level oxide layer 24 extending from various portions of the silicon substrate 10. Inter-level oxide layer 24 is formed by a CVD deposition. The inter-level oxide is used to insulate portions of the device. Over elements 12a, 12b and 12c of the conductive oxide material, the structure includes contact holes 26a, 26b and 26c. The contact holes are filled, for example, with a TiN layer or W deposition.

FIGS. 1 and 2 and the various materials and structures shown therein illustrate stages of manufacturing a semiconductor device, according to an example embodiment of the present invention. In one specific method implementation of the present invention, a wafer is fabricated up to a first stage in the manufacturing process wherein a first deposition of oxide covers the silicon substrate 10. ITO is then deposited onto the wafer, as depicted by 12a, 12b and 12c of FIG. 1. In another embodiment, YBCO may be used instead of ITO. In an example embodiment, the etch-stops are approximately 100 to 500 Å thick. Next, a photo-mask is applied to the structure and unmasked ITO is removed. FIG. 1 illustrates this stage of the manufacturing process.

FIG. 2 illustrates the next stage of the manufacturing process wherein a first inter-level oxide is deposited over the structure. Also shown in FIG. 2 are the openings 26a, 26b and 26c. These openings are the result of photo-masking for the contacts at 12a, 12b and 12c (see FIG. 1), and contact etching into the openings 26a, 26b and 26c down to the upper surfaces of the conductive oxide material, such as the illustrated ITO or YBCO elements 12a, 12b, and 12c. Contact etching of the inter-level oxide layer can be performed by either conventional L1 contact etching or tungsten contact etching.

After this step of contact etching, while using the ITO or YBCO as an etch stop, a subsequent etching process can be applied (optionally) to remove any ITO or YBCO layer as located in the openings 26a, 26b and 26c. The etching process for removal of the ITO or YBCO layer involves plasma or wet etching. The photo-mask is then removed, and standard processing techniques such as tungsten deposition and other MOS related steps are implemented.

Using the present invention, a conductive oxide material, such as ITO or YBCO, is used as an oxide etch stop. These materials are advantageous relative to conventional etch stops, such as silicon nitride, due to their high conductivity. For example, YBCO has a resistivity of only about 10 Ohms per square centimeter at room temperature. It is therefore used in superconductor applications. Whereas silicon nitride is an insulator, conductive oxide materials such as ITO and YBCO do not adversely impact the silicon conductor device with residual resistive material.

The present invention should not be considered limited to the particular examples described above, but rather should be understood to cover all aspects of the invention as set forth in the appended claims. Various modifications, equivalent processes, as well as numerous structures to which the present invention may be applicable will be readily apparent to those of skill in the art to which the present invention is directed. The claims are intended to cover such modifications, processes, and devices.

What is claimed is:

1. A process of forming a semiconductor device, comprising the steps of:

fabricating a wafer structure up to a first level oxide deposition;

depositing a conductive etch stop over the first level oxide deposition;

photo-masking the conductive etch stop and selectively removing unmasked portions of the conductive etch stop;

depositing an inter-level oxide layer on the conductive etch stop;

etching the selected portions of the inter-level oxide deposition to the conductive etch stop; and removing selected portions of the photo-mask.

2. The process of claim 1, wherein the conductive etch stop is a conductive metallic oxide material.

3. The process of claim 2, wherein the conductive etch stop is approximately from 100 to 500 Å thick.

4. The process of claim 2, further comprising the step of removing the conductive metallic oxide material exposed after the etching step.

5. The process of claim 2, wherein the conductive metallic oxide material is indium tin oxide.

6. The process of claim 2, wherein the conductive metallic oxide material is yttrium barium copper oxide.

7. The process of claim 1, further comprising the steps of:

providing a dielectric gate element on the first level oxide deposition; and providing the conductive oxide material lateral to the dielectric gate element.

8. The process of claim 1, wherein the etching step includes the step of Tungsten etching the inter-level oxide deposition.

9. The process of claim 7, wherein the conductive oxide material is selected from the group of indium tin oxide and yttrium barium copper oxide.

10. The process of claim 9, wherein the etching step includes the step of Tungsten etching the inter-level oxide deposition.

11. The process of claim 9, wherein the etching step includes the step of L1 etching the inter-level oxide deposition.

12. The process of claim 7, wherein the conductive oxide material is selected from the group of indium tin oxide and yttrium barium copper oxide, and further comprising:

forming a polysilicon gate electrode over the gate dielectric;

forming a Ti Silicide layer over the gate electrode; and depositing a conductive etch stop over the Ti Silicide layer.

13. The process of claim 12, wherein the etching step includes the step of Tungsten etching the inter-level oxide deposition.

14. The process of claim 12, wherein the etching step includes the step of L1 etching the inter-level oxide deposition.

* * * * *